(12) United States Patent
Chen

(10) Patent No.: US 10,230,047 B2
(45) Date of Patent: Mar. 12, 2019

(54) RRAM DEVICE AND METHOD FOR MANUFACTURING THE SAME

(71) Applicant: Winbond Electronics Corp., Taichung (TW)

(72) Inventor: Frederick Chen, Zhubei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/920,635

(22) Filed: Oct. 22, 2015

(65) Prior Publication Data

US 2017/0117463 A1    Apr. 27, 2017

(51) Int. Cl.
*H01L 45/00* (2006.01)
*H01L 27/24* (2006.01)

(52) U.S. Cl.
CPC .......... *H01L 45/08* (2013.01); *H01L 27/2436* (2013.01); *H01L 45/12* (2013.01); *H01L 45/1233* (2013.01); *H01L 45/1246* (2013.01); *H01L 45/1253* (2013.01); *H01L 45/146* (2013.01); *H01L 45/16* (2013.01); *H01L 45/1608* (2013.01)

(58) Field of Classification Search
CPC ..... H01L 27/2436; H01L 45/08; H01L 45/12; H01L 45/1233; H01L 45/1246; H01L 45/1253; H01L 45/146; H01L 45/16; H01L 45/1608
USPC ............................................. 257/40; 438/382
See application file for complete search history.

(56) References Cited

U.S. PATENT DOCUMENTS

| | | | |
|---|---|---|---|
| 8,198,620 B2 | 6/2012 | Chen et al. | |
| 8,569,172 B1* | 10/2013 | Jo | H01L 45/1253 257/261 |
| 8,796,102 B1* | 8/2014 | Clark | H01L 45/08 257/3 |
| 2010/0019219 A1* | 1/2010 | Lee | H01L 45/08 257/4 |
| 2011/0291066 A1* | 12/2011 | Baek | H01L 45/08 257/4 |
| 2012/0091419 A1 | 4/2012 | Chen et al. | |
| 2015/0028279 A1* | 1/2015 | Hopstaken | H01L 45/16 257/4 |

FOREIGN PATENT DOCUMENTS

| | | |
|---|---|---|
| CN | 102683584 A | 9/2012 |
| CN | 104425715 A | 3/2015 |

* cited by examiner

*Primary Examiner* — Cuong Q Nguyen
*Assistant Examiner* — Tong-Ho Kim
(74) *Attorney, Agent, or Firm* — Muncy, Geissler, Olds & Lowe, P.C.

(57) ABSTRACT

An RRAM device is provided, which includes a bottom electrode in an oxide layer, a plurality of dielectric protrusions on the oxide layer, wherein the bottom electrode is disposed between the two adjacent dielectric protrusions. A resistive switching layer is conformally disposed on the dielectric protrusions, the oxide layer, and the bottom electrode. A conductive oxygen reservoir layer is disposed on the resistive switching layer, and an oxygen diffusion barrier layer is disposed on the conductive oxygen reservoir layer.

11 Claims, 5 Drawing Sheets

RRAM DEVICE AND METHOD FOR MANUFACTURING THE SAME

BACKGROUND

Technical Field

The disclosure relates to an RRAM device, and in particular it relates to a MIM stack of an RRAM device, and a method for manufacturing the same.

Description of the Related Art

Resistive random access memory (RRAM) devices have become a major type of newly developed non-volatile memory due to the following advantages: low power consumption, low operation voltage, short write and erase time, long endurance, long data retention time, non-destructive read operation, multi-state memory, simple manufacture, and scalable properties. The basic structure of the RRAM device includes a metal-insulator-metal (MIM) stack of a bottom electrode, a resistive switching layer, and a top electrode. The resistive switching (RS) property is the important property of the RRAM device. In general, a whole bottom electrode layer, a whole resistive switching layer, and a whole top electrode layer are formed and then patterned by lithography and etching processes to define an array of a plurality of MIM stacks. However, the etching process usually damages the sidewalls of the MIM stacks to degrade the performance of the MIM stacks.

Accordingly, a novel RRAM device and method for manufacturing the same for overcoming above shortcomings are called-for.

BRIEF SUMMARY

One embodiment of the disclosure provides an RRAM device, including a bottom electrode in an oxide layer; a plurality of dielectric protrusions on the oxide layer, wherein the bottom electrode is disposed between the two adjacent dielectric protrusions; a resistive switching layer conformally disposed on the dielectric protrusions, the oxide layer, and the bottom electrode; a conductive layer disposed on the resistive switching layer; and an oxygen diffusion barrier layer is disposed on the conductive layer.

One embodiment of the disclosure provides a method of manufacturing an RRAM device, including: forming a bottom electrode in an oxide layer; forming a plurality of dielectric protrusions on the oxide layer, wherein the bottom electrode is disposed between two adjacent dielectric protrusions; conformally forming a resistive switching layer on the dielectric protrusions, the oxide layer, and the bottom electrode; forming a conductive layer on the resistive switching layer; and forming an oxygen diffusion barrier layer on the conductive layer.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
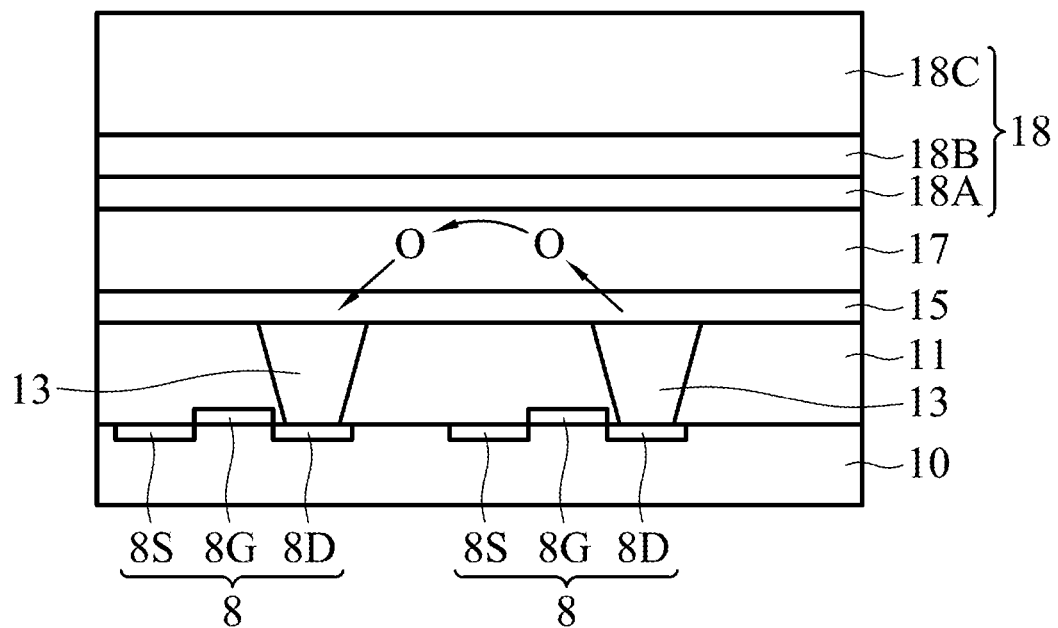
FIG. 1 shows a MIM stack in one embodiment of the disclosure.

The structure in FIG. 1 can be adopted to solve the problems of the conventional process. First, a transistor 8 is formed on a substrate 10. In one embodiment, a gate 8G is formed on the substrate 10, and a source electrode 8S and a drain electrode 8D are formed in the substrate 10 and adjacent to two sides of the gate electrode 8G. Note that the transistor 8 is just for illustration and not for limiting the scope of the disclosure. An oxide layer 11 is then formed on the substrate 10 and the transistor 8, and an opening is formed in the oxide layer 11 to expose a part of the drain electrode 8D by lithography and etching processes. A bottom electrode layer is deposited on the oxide layer 11 and in the opening, and the bottom electrode layer over the top surface of the oxide layer 11 is removed by a planarization process, thereby forming bottom electrodes 13 to contact the transistor 8 (e.g. the drain electrode 8D). Thereafter, a resistive switching layer 15, a conductive oxygen reservoir layer 17 (e.g., Ti), and an oxygen diffusion barrier layer 18 (e.g. a TiN layer 18A/a TiON layer 18B/a TiN layer 18C) are formed on the oxide layer 11 and the bottom electrode 13. The oxygen diffusion barrier 18 is an electrically conductive structure, and the TiN layer 18C may serve as a top electrode.

The bottom electrode layer, the resistive switching layer, and the top electrode layer are patterned by etching to define MIM stacks in the conventional process, which may damage the sidewalls of the MINI stacks. The above problem can be solved by the structure in FIG. 1. However, the adjacent MIM stacks easily interfere with each other. Theoretically, when a write voltage is applied to the right bottom electrode 13, only the oxygen in the resistive switching layer 15 corresponding to the right bottom electrode 13 should migrate to the conductive oxygen reservoir layer 17 corresponding to the right bottom electrode 13. However, the oxygen in the resistive switching layer 15 corresponding to the right bottom electrode 13 may migrate to the conductive oxygen reservoir layer 17 corresponding to the left bottom electrode 13, thereby interfering the state of the left MIM stack. The interference problem will be worsened by a shorter distance between the adjacent bottom electrodes 13.

Figure 2:
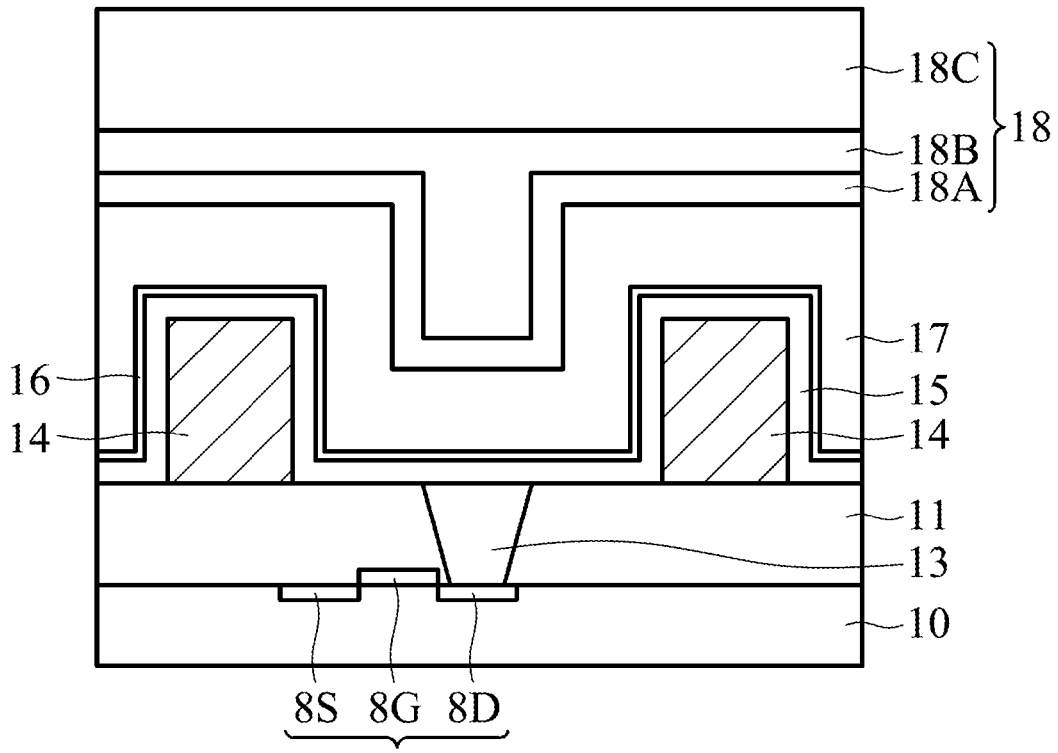
FIG. 2 shows a MIM stack in one embodiment of the disclosure.

In another embodiment, the interference problem resulting from oxygen migration can be solved by dielectric protrusions. As shown in FIG. 2, a substrate 10 such as silicon substrate is provided. A transistor 8 is formed on the substrate 10. An oxide layer 11 is then formed on the substrate 10. In one embodiment, the oxide layer 11 can be silicon oxide, and a manufacture of the oxide layer 11 can be thermal oxidation, chemical vapor deposition, or other suitable method. An opening is then formed in the oxide layer 11 to expose the drain electrode 8D of the transistor 8 by lithography and etching processes, and bottom electrode layer is then deposited on the oxide layer 11 and the in the opening. In one embodiment, the bottom electrode layer can be aluminum, titanium, titanium nitride (TiN), or a combination thereof. The bottom electrode layer can be formed by E-beam evaporation, sputtering, or physical vapor deposition (PVD). The bottom electrode layer over the top surface of the oxide layer 11 is then removed by a planarization process (e.g. CMP) to form a bottom electrode 13 contacting the drain electrode 8D of the transistor 8. In one embodiment, the bottom electrode 13 has a thickness of 10-100 nm, which is similar to a thickness of the oxide layer 11. The bottom electrode typically has a beveled top (not shown), which is advantageous for avoiding high electric fields and current crowding from sharp corners.

Dielectric protrusions 14 are then formed on the oxide layer 11. As shown in FIG. 2, one bottom electrode 13 is disposed between the two adjacent dielectric protrusions 14. It should be understood that one dielectric protrusion 14 is disposed between two adjacent bottom electrodes 13. In other words, the bottom electrodes 13 and the dielectric protrusions 14 are alternately arranged. The dielectric protrusions 14 may surround the bottom electrode in both x and y horizontal directions and may even be linked to form an interconnected grid. The dielectric protrusions 14 can be formed as below: a whole dielectric layer is formed on the bottom electrode 13 and the oxide layer 11, and then patterned to define the dielectric protrusions 14 by lithography and etching processes. In one embodiment, the dielectric layer for the dielectric protrusions 14 can be composed of aluminum oxide (alumina, $Al_2O_3$), silicon nitride, silicon oxide, silicon oxynitride, or the like.

Subsequently, a resistive switching layer 15 is conformally formed on the dielectric protrusions 14, the oxide layer 11, and the bottom electrode 13. In one embodiment, the resistive switching layer 15 can be composed of hafnium oxide, titanium oxide, tungsten oxide, tantalum oxide, or zirconium oxide. In one embodiment, the resistive switching layer 15 is formed by atomic layer deposition (ALD).

Subsequently, an oxygen diffusion barrier layer 16 is conformally formed on the resisitive switching layer 15. In one embodiment, the oxygen diffusion barrier layer 16 is formed by ALD. The oxygen diffusion barrier layer 16 is optional and can be omitted in some embodiment.

Subsequently, a conductive oxygen reservoir layer 17 is conformally formed on the oxygen diffusion harrier layer 16. In one embodiment, the conductive oxygen reservoir layer 17 can be aluminum, titanium, or a combination thereof. The conductive oxygen reservoir layer 17 can be formed by E-beam evaporation, sputtering, or PVD. In one embodiment, the bottom electrode 13 and the conductive oxygen reservoir layer 17 are composed of different materials, e.g. the bottom electrode 13 being TiN and the conductive oxygen reservoir layer 17 being titanium.

A TiN layer 18A is then conformally formed on the conductive oxygen reservoir layer 17, a TiON layer 18B is then blanketly formed on the TiN layer 18A, and a TiN layer 18C is then formed on the TiON layer 18B. The TiN layer 18A, the TiON layer 18B, and the TiN layer 18C construct an oxygen diffusion barrier layer 18, which may avoid oxygen (migrating from the resistive switching layer 15) in the conductive oxygen reservoir layer 17 of escaping upward and out of the conductive oxygen reservoir layer 17. In this embodiment, the TiON layer 18B has a thickness of 5 nm to 8 nm, and the TiN layers 18A and 18C have a thickness of 9 nm to 12 nm. An overly thin TiON layer 18B cannot efficiently prevent the oxygen in the conductive oxygen reservoir layer 17 (migrating from the resistive switching layer 208) from escaping upward and out of the conductive oxygen reservoir layer 17 without applying voltage to the RRAM device. An overly thick TiON layer 18B may largely increase the total resistance of the MIM stack and the driving voltage of the RRAM device, or even make the RRAM device ineffective. In one embodiment, the TiN layer 18A and 18C and the TiON layer 18B can be formed by E-beam evaporation, sputtering, or PVD. Although the TiN layer 18C has a planar top surface, it may have a non-planar top surface in practice. Alternatively, the TiN layer 18A can be replaced with an alumina layer having a thickness of 0.3 nm to 0.6 nm, and the TiON layer 18B can be replaced with a TiN layer having a thickness of 9 nm to 12 nm. The alumina layer can be formed by ALD. An overly thin alumina layer cannot efficiently prevent the oxygen in the conductive oxygen reservoir layer 17 (migrating from the resistive switching layer 15) from escaping upward and out of the conductive oxygen reservoir layer 17 without applying voltage to the RRAM device. An overly thick alumina layer may largely increase the total resistance of the MIM structure and the driving voltage of the RRAM device, or even make the RRAM device be ineffective.

Because the dielectric protrusions 14, the oxygen migrating from the switching resistive switching layer 15 to the conductive oxygen reservoir layer 17 corresponding to one bottom electrode 13 cannot easily migrate to the conductive oxygen reservoir layer 17 corresponding to the adjacent bottom electrode 13 as shown in FIG. 1. In short, the dielectric protrusions 14 may efficiently solve the interference problem between the adjacent MIM stacks.

Figure 3:
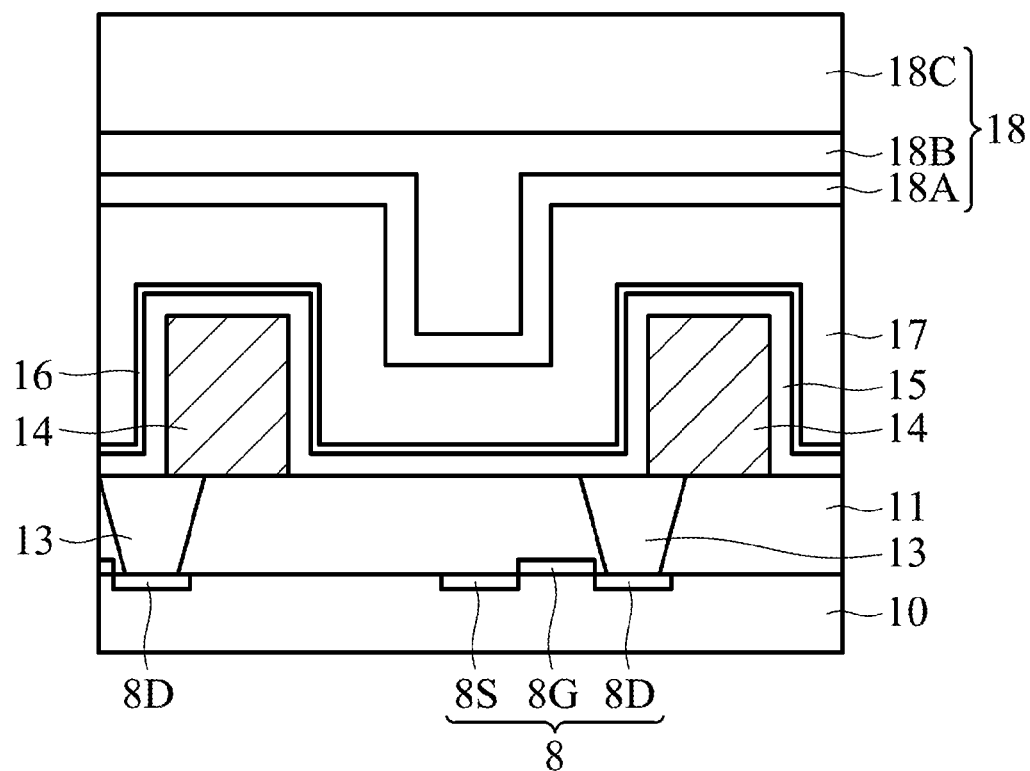
FIG. 3 shows a MIM stack in one embodiment of the disclosure.
Figure 4A:
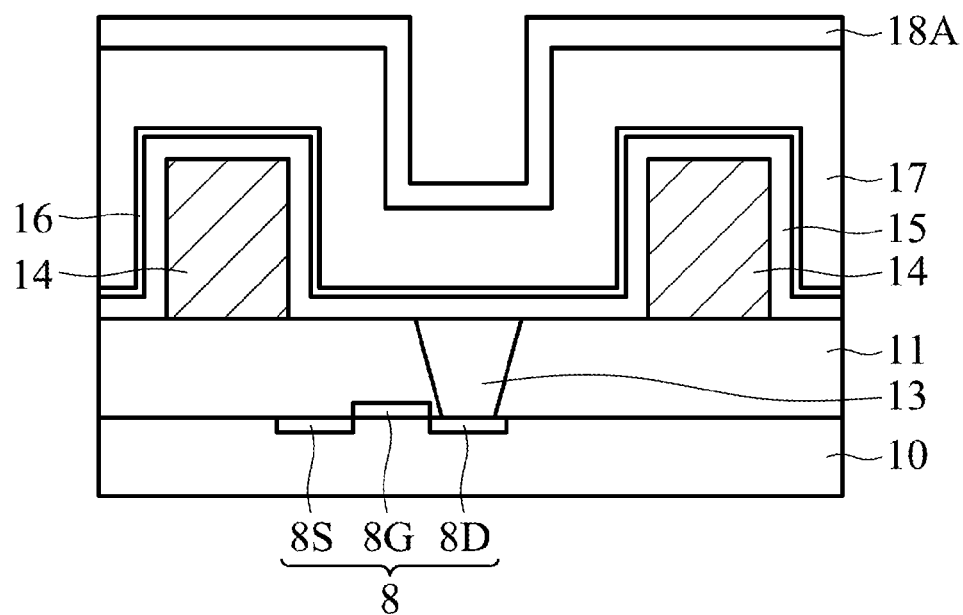
FIGS. 4A to 4C show a MIM stack during a process for manufacturing the same in one embodiment of the disclosure.
Figure 4B:
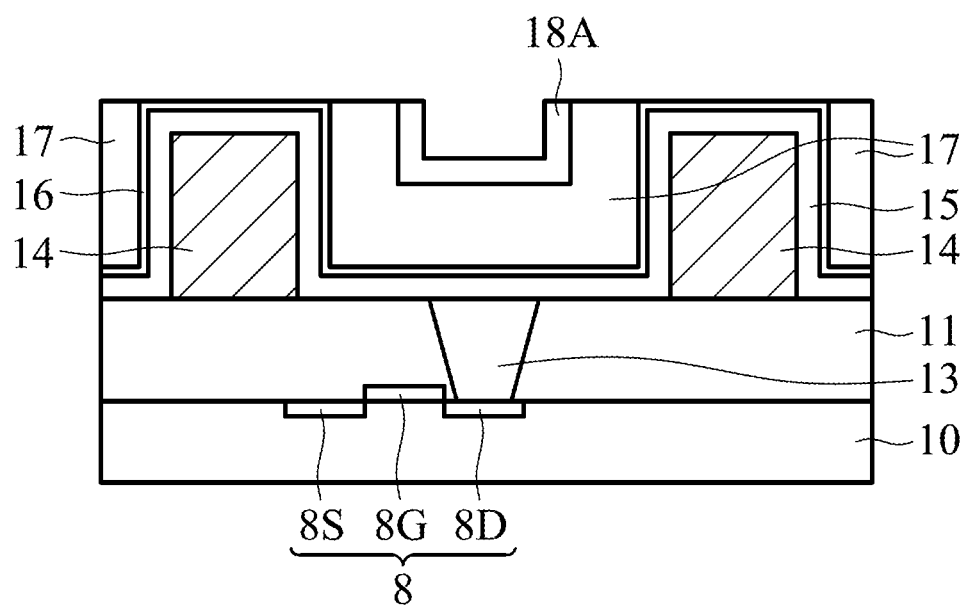
Figure 4C:
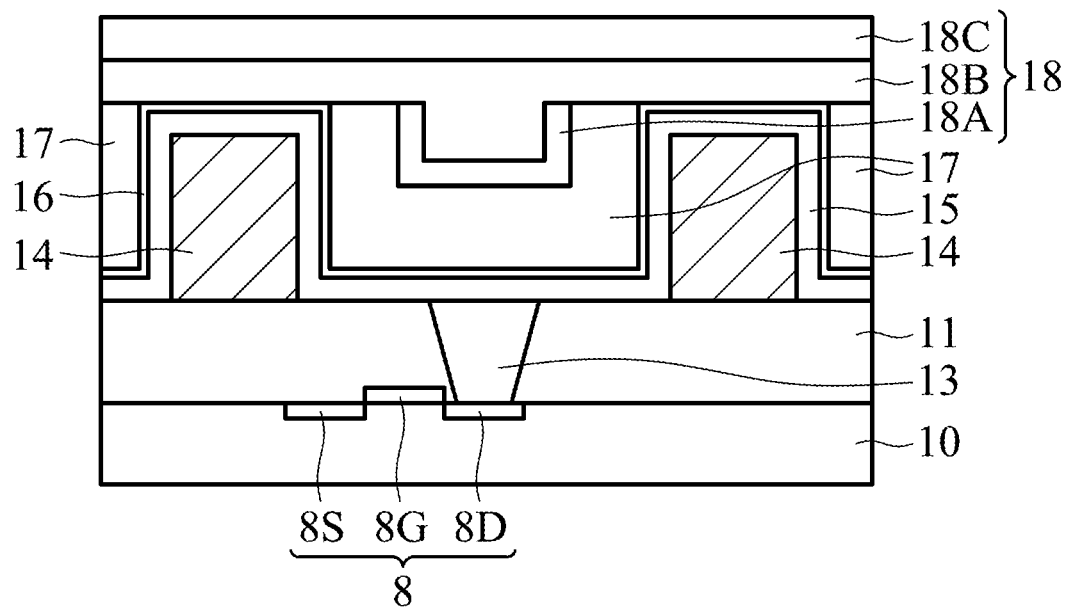

FIG. 3 is similar to FIG. 2, and the difference in FIG. 3 is the dielectric protrusion 14 overlaps a part (not a whole) of the bottom electrode 13. The structure in FIG. 3 may further reduce the active area, and therefore reducing the leakage current and the driving voltage of the MIM stack. It should be understood that the TiN layer 18A can be replaced with an alumina layer having a thickness of 0.3 nm to 0.6 nm, and the TiON layer 18B can be replaced with a TiN layer having a thickness of 9 nm to 12 nm. The problem such as oxygen (from the resistive switching layer 15) in the conductive oxygen reservoir layer 17 of one MIM stack migrating to the conductive oxygen reservoir layer 17 of another MIM stack adjacent to the MIM stack can be further solved by a MIM stack manufactured through the process in FIGS. 4A to 4C. First, a transistor 8 is formed on a substrate 10, an oxide layer 11 is formed on the transistor 8 and the substrate 10, a bottom electrode 13 is formed in the oxide layer 11 to contact a drain electrode 8D of the transistor 8, and dielectric protrusions 14 are then formed on the oxide layer 11. Thereafter, a resistive switching layer 15, an oxygen diffusion barrier layer 16, a conductive oxygen reservoir layer 17, and a TiN layer 18A are sequentially and conformally formed on the dielectric protrusions 14, the oxide layer 11, and the bottom electrode 13, as shown in FIG. 4A. The conductive oxygen reservoir layer 17 and the TiN layer 18A over the top of the oxygen diffusion barrier layer 16 is then removed by a planarization process (e.g. CMP) to expose the oxygen diffusion barrier layer 16 on the dielectric protrusions 15, as shown in FIG. 4B. A TiON layer 18B is then blanketly formed on the conductive oxygen reservoir layer 17, the TiN layer 18A, and the exposed oxygen diffusion barrier layer 16, as shown in FIG. 4C. A TiN layer 18C is then formed on the TiON layer 18B, and the TiN layer 18C may serve as a top electrode of this MIM stack, as shown in FIG. 4C. The materials and manufactures of above layers are similar to that in previous embodiment, such that the related descriptions are omitted here. Compared to the MIM stack in FIG. 2, the conductive oxygen reservoir layer 17 of the different MIM stacks are divided to several segments by the dielectric protrusions 14 FIG. 4C, thereby further preventing the adjacent MIM stacks from interfering with each other.

Figure 5A:
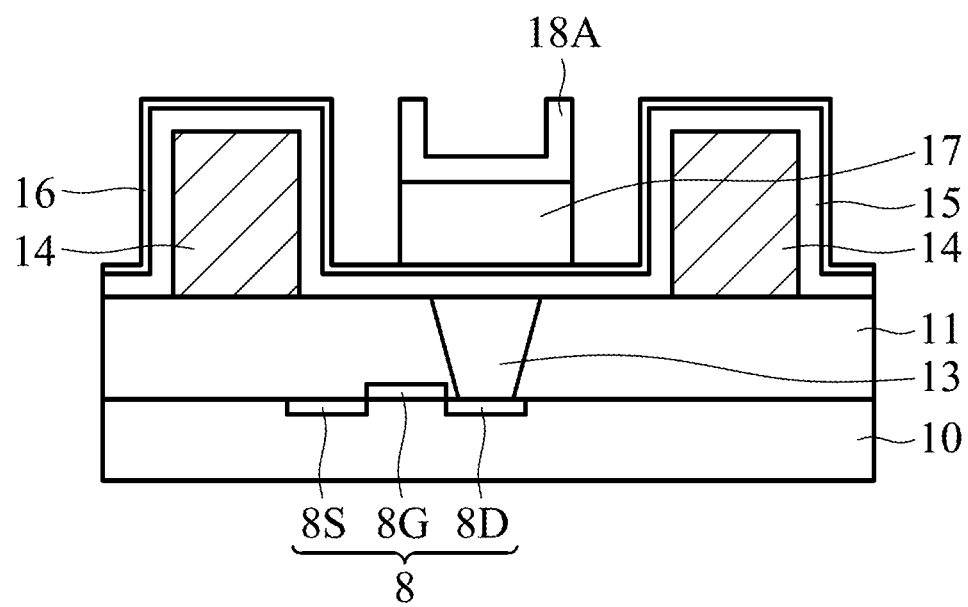
FIGS. 5A to 5B show a MIM stack during a process for manufacturing the same in one embodiment of the disclosure.
Figure 5B:
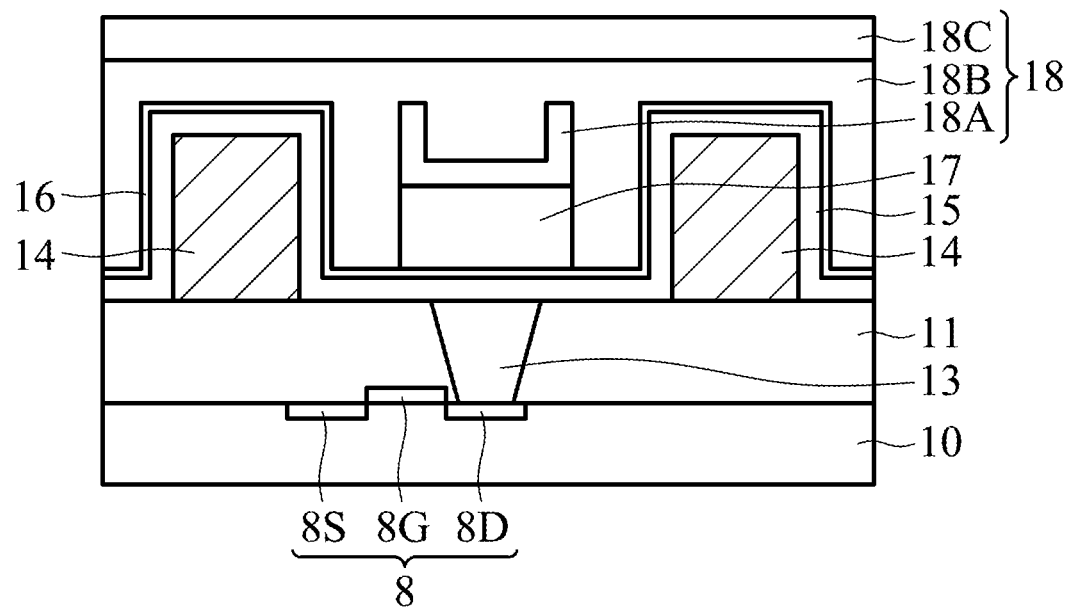

In one embodiment, a transistor 8 is formed on a substrate 10, an oxide layer 11 is formed on the transistor 8 and the substrate 10, a bottom electrode 13 is formed in the oxide layer 11 to contact a drain electrode 8D of a transistor 8, and dielectric protrusions 14 are then formed on the oxide layer 11. The bottom electrode 13 is disposed between two dielectric protrusions 14. A resistive switching layer 15, an oxygen diffusion barrier layer 16, a conductive oxygen reservoir layer 17, and a TiN layer 18A are sequentially and conformally formed on the dielectric protrusions 14, the oxide layer 11, and the bottom electrode 13, as shown in FIG. 4A. The conductive oxygen reservoir layer 17 and the TiN layer 18A over the top of the oxygen diffusion barrier layer 16 are removed by a planarization process to expose the oxygen diffusion barrier layer 16 on the dielectric protrusions 14, as shown in FIG. 4B. Subsequently, the TiN layer 18A serves as an etch mask, and the conductive oxygen reservoir layer 17 not covered by the TiN layer 18A is then etched away, as shown in FIG. 5A. A TiON layer 18B is then blanketly formed on the TiN layer 18A and the oxygen diffusion barrier layer 16, and a TiN layer 18C is then formed on the TiON layer 18B, wherein the TiN layer 18C may serve as a top electrode of this MIM stack, as shown in FIG. 5B. The materials and manufactures of above layers are similar to that in previous embodiment, such that the related descriptions are omitted here. In FIG. 5B, the conductive oxygen reservoir layer 17 of different MIM stacks is divided by the dielectric protrusions 14 to several segments. In addition, the conductive oxygen reservoir layer 17 and the dielectric protrusions 14 are separated by parts of the oxygen diffusion harrier layer 18 (the TiON layer 18B) and the oxygen diffusion barrier layer 16, thereby preventing the adjacent MIM stacks from interfering with each other. Moreover, the area of the conductive oxygen reservoir layer 17 (active area) is further reduced by the above processes, thereby reducing the leakage current and driving voltage of the MIM stack.

Figure 6A:
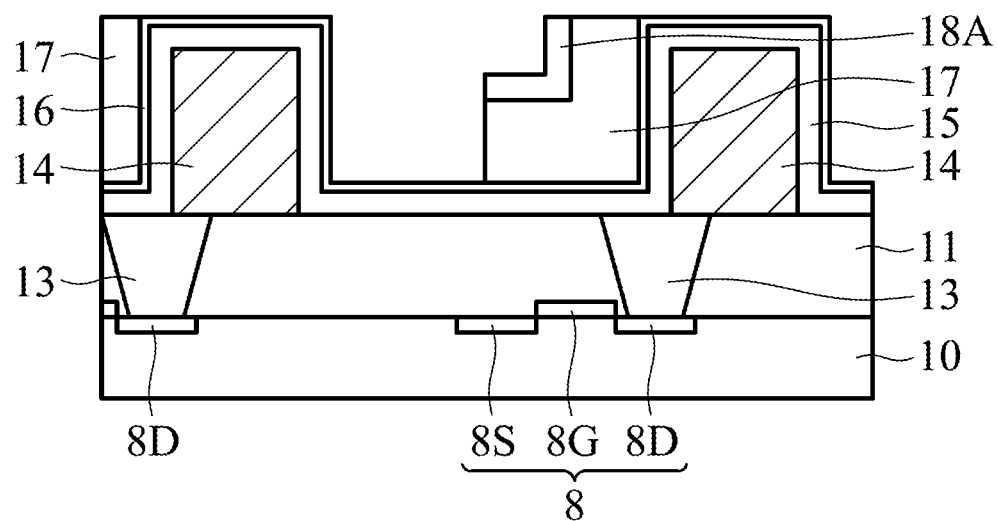
FIGS. 6A to 6B show a MIM stack during a process for manufacturing the same in one embodiment of the disclosure.
Figure 6B:
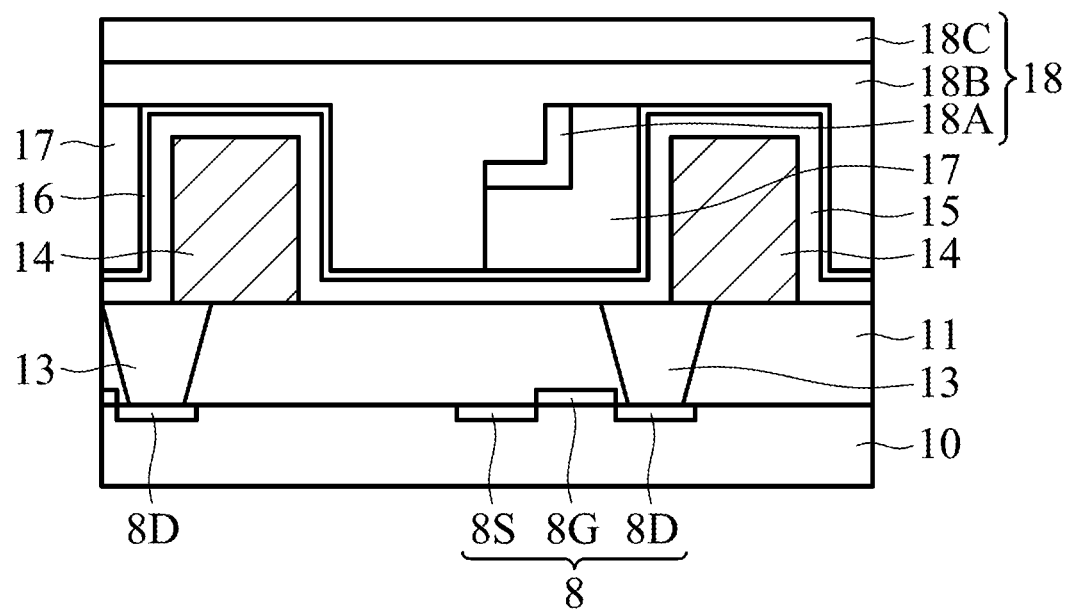

In one embodiment, a transistor 8 is formed on a substrate 10, an oxide layer 11 is formed on the transistor 8 and the substrate 10, a bottom electrode 13 is formed in the oxide layer 11 to contact a drain electrode 8D of a transistor 8, and dielectric protrusions 14 are then formed on the oxide layer 11 and a part of the bottom electrode 13. A resistive switching layer 15, an oxygen diffusion barrier layer 16, a conductive oxygen reservoir layer 17, and a TiN layer 18A are sequentially and conformally formed on the dielectric protrusions 14, the oxide layer 11, and the bottom electrode 13, as shown in FIG. 6A. The conductive oxygen reservoir layer 17 over the top of the oxygen diffusion barrier layer 16 is then removed by a planarization process such as CMP to expose the oxygen diffusion barrier layer 16 on the dielectric protrusions 14, as shown in FIG. 6A. One side of the conductive oxygen reservoir layer 17 and the TiN layer 18A are then removed by lithography and etching processes, as shown in FIG. 6A. A TiON layer 18B is then blanketly formed on the above structure, and a TiN layer 18C is then formed on the TiON layer 18B, as shown in FIG. 6B. The TiN layer 18C may serve as a top electrode of the MIM stack. The materials and manufactures of above layers are similar to that in previous embodiment, such that the related descriptions are omitted here. In FIG. 6B, the conductive oxygen reservoir layer 17 of the different MIM stacks are divided into several segments by the dielectric protrusions 14, thereby further preventing the adjacent MIM stacks from interfering with each other. Moreover, the area of the conductive oxygen reservoir layer 17 (active area) is further reduced by the above processes, thereby reducing the leakage current and driving voltage of the MIM stack.

Accordingly, the MIM stacks in various embodiments include a bottom electrode 13 in the oxide layer 11 on the substrate 10, a plurality of dielectric protrusions 14 on the oxide layer 11, wherein the bottom electrode 13 is disposed between the two adjacent dielectric protrusions 14. The MIM stack also includes the resistive switching layer 15, the oxygen diffusion barrier layer 16, and the conductive oxygen reservoir layer 17 sequentially and conformally disposed on the dielectric protrusions 14, the oxide layer 11, and the bottom electrode 13. The MIM stack also includes an oxygen diffusion barrier layer 18 on the conductive oxygen reservoir layer 17. Because the dielectric protrusions 14 may increase the migration path length of the oxygen (from the resistive switching layer 15) in the conductive oxygen reservoir layer 17 between the adjacent MIM stacks, or even cut the conductive oxygen reservoir layer 17 of the adjacent MIM stacks to segments, thereby efficiently solving the interference problem of the adjacent MIM stacks.

It should be understood that the TiN layer 18C (serving as the top electrode) may connect to an external circuit or device through a top electrode contact plug (not shown), or directly connect to the external circuit or device. In one embodiment, the MIM stack constructed of the bottom electrode 13, the resistive switching layer 15, the conductive oxygen reservoir layer 17, and the oxygen diffusion barrier layer 18 can be utilized in the RRAM device.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An RRAM device, comprising:
    a bottom electrode in an oxide layer, wherein the top surface of the bottom electrode and the top surface of the oxide layer are co-planar;
    a plurality of dielectric protrusions on the oxide layer, without aligning with the bottom electrode;
    a resistive switching layer conformally disposed on and contacting the dielectric protrusions, the oxide layer, and the bottom electrode;
    a conductive oxygen reservoir layer disposed on the resistive switching layer, wherein the conductive oxygen reservoir layer has a recess; and
    an oxygen diffusion barrier layer disposed on the conductive oxygen reservoir layer and completely filling the recess of the conductive oxygen reservoir layer.

2. The RRAM device as claimed in claim 1, where the dielectric protrusions are parts of an interconnected grid protruding on the oxide layer without aligning with the bottom electrode.

3. The RRAM device as claimed in claim 1, where the dielectric protrusions are composed of aluminum oxide (alumina) or silicon nitride.

4. The RRAM device as claimed in claim 1, further comprising another oxygen diffusion barrier layer between the resistive switching layer and the conductive oxygen reservoir layer.

5. The RRAM device as claimed in claim 1, wherein the conductive oxygen reservoir layer is conformally disposed on the resistive switching layer.

6. The RRAM device as claimed in claim 1, wherein the conductive oxygen reservoir layer is divided into parts separated from each other by the dielectric protrusions.

7. The RRAM device as claimed in claim 6, wherein the conductive oxygen reservoir layer and the dielectric protrusions are separated by a part of the oxygen diffusion barrier layer.

8. The RRAM device as claimed in claim 1, wherein the bottom electrode and one of the dielectric protrusions are partially overlapped.

9. The RRAM device as claimed in claim 8, wherein the conductive oxygen reservoir layer is closer to one of the two adjacent dielectric protrusions than another one of the two adjacent dielectric protrusions.

10. The RRAM device as claimed in claim 1, wherein the oxygen diffusion barrier layer includes a TiON layer disposed between two TiN layers.

11. The RRAM device as claimed in claim 1, wherein the oxygen diffusion barrier layer includes an alumina layer and a TiN layer.

* * * * *